INVENTOR.
LEO ESAKI
BY John F. Ohlandt Jr.
ATTORNEY

Sept. 28, 1965 LEO ESAKI 3,209,215

HETEROJUNCTION TRIODE

Filed June 29, 1962 2 Sheets-Sheet 2

3,209,215

HETEROJUNCTION TRIODE

Leo Esaki, Briarcliff Manor, N.Y., assignor to International Business Machines Corporation, New York, N.Y., a corporation of New York Filed June 29, 1962, Ser. No. 206,304
12 Claims. (Cl. 317—234)

This invention relates to semiconductive devices and, in particular, to novel semiconductor structures wherein are incorporated heterojunctions.

The conventional junction transistor, as is well known in the art, may briefly be described in its simplest form as a device which has three regions alternating in conductivity-type. Thus, the two standard examples are the N-P-N and P-N-P junction transistors wherein the conductivity-type of the middle, base region, is opposite to the conductivity-type of the two end regions which are denominated the emitter and collector regions.

In the typical operation of the conventional junction transistor, the input junction is so biased as to cause injection of carriers from the emitter region into the base region, which carriers are minority carriers in the base region. For example, in the case of an N-P-N transistor, the injected carriers would be electrons, and in the P-N-P case, the injected carriers would be holes.

Contrasted with the conventional transistor, the present invention proposes a heterojunction structure, i.e., a structure which involves the integral union of several semiconductor materials but which is single conductivity in nature. Thus, the present invention provides a three-terminal device which, rather than relying on conventional injection and consequent diffusion of minority carriers, is primarily based on the difference in the barrier heights which exist for the contacting surfaces of the several semiconductor materials in the integral structure. The essential operation relies on the flow of majority carriers which may be either electrons or holes.

It is, therefore, an object of the present invention to provide a fast switching device which has an extremely short transit time.

Another object is to produce a device involving no storage time for minority carriers because minority carriers are not involved in its operation.

Yet another device is to provide a device having a small base resistance due to the large electron concentration in the base region because of the peculiar nature of the curvature in the band edge for the materials of which the device is composed.

Still another object is to produce a device having extremely small junction capacitance.

The foregoing and other objects, features and advantages of the invention will be apparent from the following more particular description of preferred embodiments of the invention, as illustrated in the accompanying drawings.

Although reference will be made hereafter to the use of specific materials, and, in particular, to germanium and gallium arsenide in the formation of heterojunction structures, it should be borne in mind that the concept of the present invention is not limited to these specific materials.

The energy band diagram for the particular case of an N-N heterojunction wherein the material of one of the regions is germanium and the material of the other region is gallium arsenide has been phenomenologically clarified to a certain extent by research workers in the semiconductor field. Particular reference may be made to an article by R. L. Anderson appearing in the IBM Journal of Research and Development, July 1960, vol. 4, No. 3, page 283.

Figure 1:
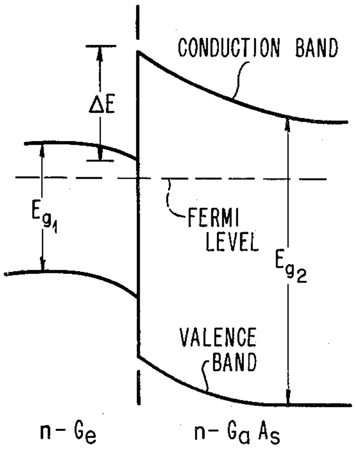
FIG. 1 is an energy band diagram for a simple N-N heterojunction.

Referring now to FIG. 1, an equilibrium energy band diagram is shown therein which depicts the energy states in an N-N heterojunction, specifically for the case where the materials are germanium and gallium arsenide. To the left in FIG. 1, the relatively narrow gap $E_{g1}$, on the order of .7 ev., is for the N-conductivity-type germanium of which this region is composed. The Fermi level consequently is known adjacent the conduction band. To the right of the figure, the relatively large energy gap $E_{g2}$ is for the gallium arsenide which has a gap of approximately 1.36 ev. The Fermi level is continued on the same level into the gallium arsenide region indicating no change in the statistical level for carriers.

From previous results it has been revealed that there is a crystal orientation dependence of the barrier height $\Delta E$. This barrier height $\Delta E$ is shown on the left in the energy diagram of FIG. 1. The barrier heights for different surfaces in gallium arsenide decrease in the following order: [111]A surface, [111]B surface and [110] surface. It is to be noted that the symbols A and B indicate, for the case of gallium arsenide, different [111] surfaces which have either a predominance of gallium or arsenic atoms, respectively. Although the difference in the barrier heights between the A and B surfaces has not yet been exactly determined, it is on the order of 0.1 ev. owing to the polar nature of gallium arsenide.

Turning now to the more sophisticated kind of structure contemplated by the present invention, two varieties of this composite structure may be realized based on the heterojunction triode principle, namely, a Ge—GaAs—Ge sandwich and a GaAs—Ge—GaAs sandwich. If the sandwiched layer in the middle is sufficiently narrow, theoretically and experimentally interesting properties are obtained in the sandwich.

Figure 2A:
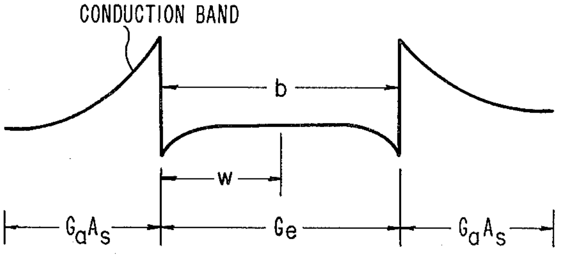
FIGS. 2A, 2B and 2C are equilibrium energy band diagrams, chosen to illustrate the underlying phenomena upon which the present invention is based.
Figure 2B:
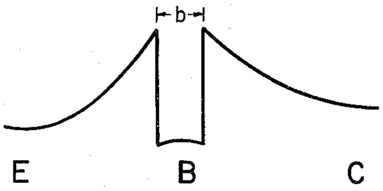
Figure 2C:
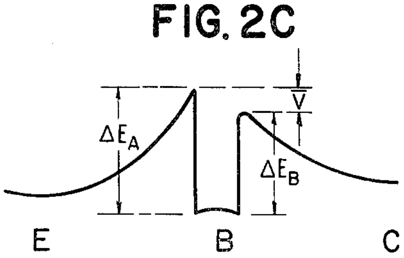

Referring now to FIGS. 2A, 2B and 2C, these figures depict several equilibrium energy band diagrams chosen to illustrate the heterojunction triode principle and applied to the preferred form of the *GaAs—Ge—GaAs* sandwich, wherein the three regions are all of N-conductivity-type.

In FIG. 2A, there is depicted the situation of a relatively thick base layer constituted of germanium and having a thickness $b$. The space charge layer thickness is denoted by the symbol $w$. FIG. 2B depicts the case where the thickness of the base layer has been reduced substantially. In this figure, the symbols E, B and C stand for the emitter, base and collector, respectively, of the heterojunction triode. The barrier heights for the two contacting surfaces of gallium arsenide are shown to be substantially identical. For simplicity, only the conduction band variation has been depicted in this and subsequent figures. With the width $b$ less than a few hundred angstroms, appreciable tunneling current across the emitter-base barrier can be expected.

In FIG. 2C, there is depicted the energy band situation for the particularly preferred case where the different [111] surfaces, i.e., the A and B surfaces, have been chosen for the emitter-base and base-collector junctions.

The left and right regions labelled E and C are, as indicated previously, composed of gallium arsenide having the particular contacting surfaces mentioned above. The middle region, i.e., the base region, is composed of germanium. As shown in FIG. 2C, there is a difference $\overline{V}$ between the barrier heights which is approximately equal to $\Delta E_A - \Delta E_B$. It is this difference in barrier heights which lends itself to special exploitation in accordance with the principles of the present invention.

Figure 2D:
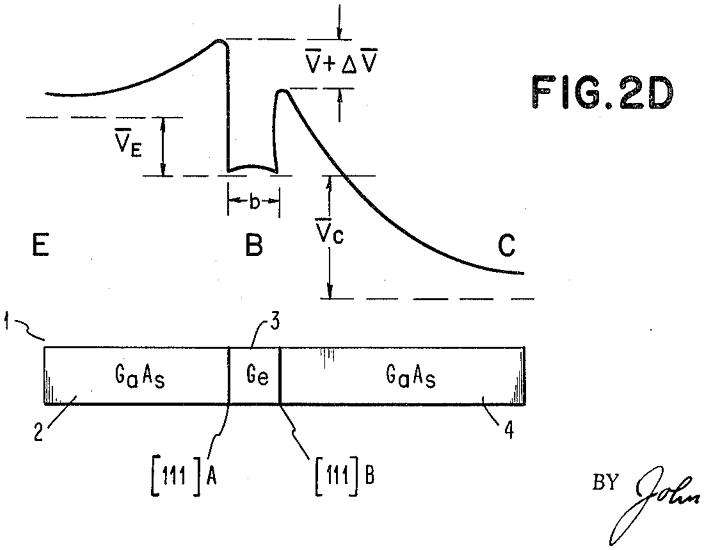
FIG. 2D depicts an energy band diagram for, and a dimensionally correlated view of, a three-layered heterojunction structure of N-conductivity-type in accordance with the present invention.

In FIG. 2D an energy band diagram is shown which is similar to that depicted in FIG. 2C. However, the energy band diagram here is for the case where the heterojunction triode is under bias conditions. A voltage $\overline{V}_E$ is so applied that the base region of germanium of the heterojunction triode is more positive than the emitter region of gallium arsenide, and this is the forward bias state. A voltage $\overline{V}_C$ is so applied that the base region is negative with respect to the collector region, and this is the reverse bias state. Thus, the emitter-base junction is forwardly biased and the base-collector junction is reverse biased. $\overline{V}_E$ and $\overline{V}_C$ as a typical example may be 0.4 volt and 2 volts respectively. The barrier height difference $\overline{V}$ is increased by $\Delta\overline{V}$, as shown in FIG. 2D, due to the image force effect, well known to those versed in the art. The base width *b* as indicated previously is made extremely narrow, on the order of several microns. With such a narrow base width, the energy loss of the majority carriers (electrons for the N-N-N structure) due to the scattering while traveling across the thin base region is less than $\overline{V}+\Delta\overline{V}$. Thus, most of the injected "hot" electrons at the emitter-base junction will be collected at the base-collector junction which results in power amplification due to the large impedance difference between the respective junctions, analogously to the case of the conventional transistor.

Though the criterion for the critical thicknesses of the base region may be strongly dependent on the quality of the germanium and on the temperature and value of $\overline{V}$, it will not be greater than a few microns.

At the bottom of FIG. 2D, the dimensionally correlated heterojunction triode structure 1 is schematically illustrated in this particular embodiment, an emitter region 2 of gallium arsenide is shown with the [111]A surface as the contacting surface which defines a junction with the base region 3 of germanium. The collector region 4 is likewise shown as composed of gallium arsenide, but the contacting surface, in this case defining the base-collector junction, is the [111]B surface of the gallium arsenide.

One way to get the composite structure, as illustrated in FIG. 2D, is by controlled successive vapor deposition of germanium and gallium arsenide as follows: The substrate is selected, for example, to be N-type gallium arsenide single crystal with an impurity concentration on the order of $10^{14}$–$10^{16}$ cm.$^{-3}$. By a preferred technique of epitaxial vapor growth, such as may be appreciated by referring to the IBM Journal of Research and Development of July 1960, vol. 4, No. 3, page 248, a layer of N-type germanium which is likewise doped on the order of $10^{14}$–$10^{16}$ cm.$^{-3}$ is grown onto the [111]A surface of the gallium arsenide substrate. The thickness of the epitaxial growth is on the order of 1–3 microns. A layer of N-type gallium arsenide, of approximately the same impurity concentration as the previously-deposited germanium layer, is now grown which will make the germanium-gallium arsenide [111]B surface heterojunction which is desired. In this case the thickness of the gallium arsenide is not important. For a preferred technique of epitaxial vapor growth of the gallium arsenide layer, reference may be made to application Serial No. 59,004, assigned to the assignee of the present invention.

Although the growth of a structure which is entirely N-type conductivity has been described, it will be apparent to those versed in the art that a sandwich which is entirely of opposite conductivity-type, i.e., of P-conductivity-type, can be fabricated in the same basic manner indicated above.

In the operation of a three-terminal heterojunction device, the temperature may be an important factor as well as the thickness of the base region in order that one can get a reasonable current amplification factor. Generally we can expect four types of scattering for injecting hot electrons; namely, acoustic phonon, optical phonon, impurity and electron-electron. Of these four categories the optical phonon gives rise to large angle scattering with approximately 0.038 ev. of energy loss per collision. The impurity scattering may be elastic and may involve no energy loss mechanism. Therefore operation at a low temperature is considered to be highly favorable.

Figure 3:
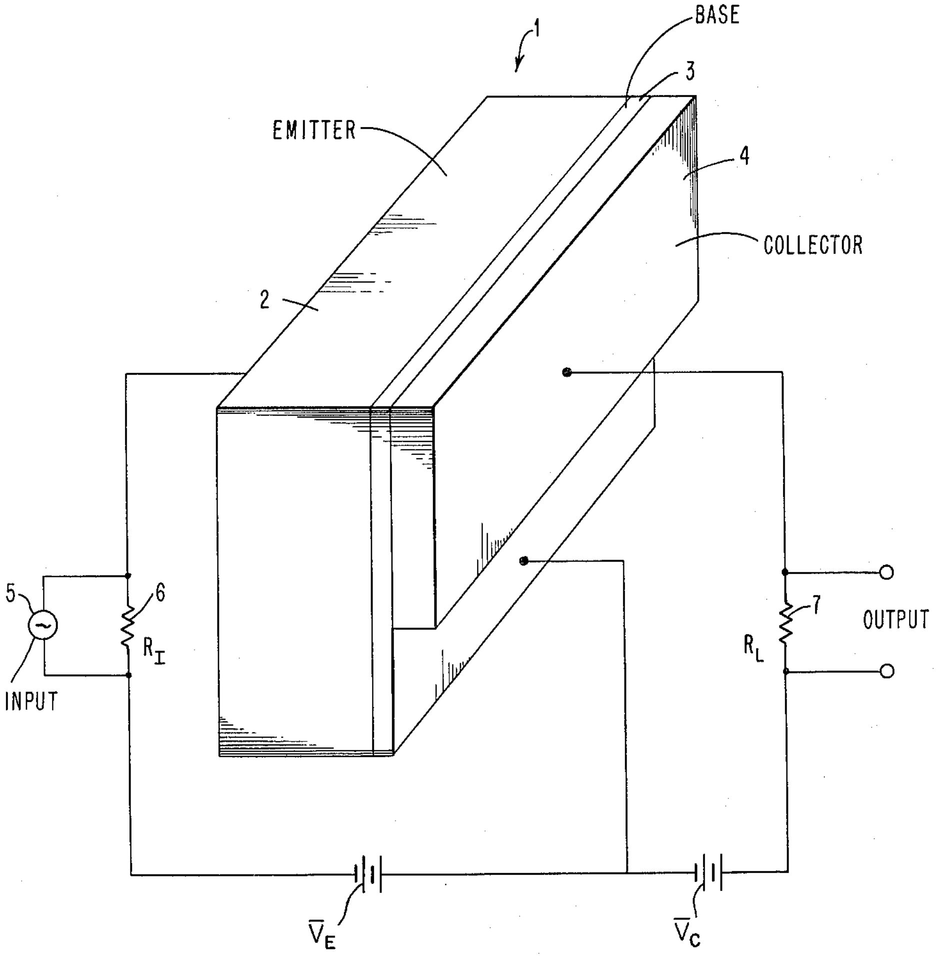
FIG. 3 is a diagram of the heterojunction structure in accordance with the present invention, suitably connected in a circuit with applied biases.

A device application for the heterojunction triode of the present invention is exemplified in FIG. 3. Here the basic structure, as previously illustrated in FIG. 2D, and fabricated as described above, is shown connected in a circuit to provide amplification. As previously indicated, there is a large difference between the impedance of the input junction, that is, the emitter-base junction, and the impedance of the output junction, that is, the base-collector junction. For the base-emitter junction the impedance is on the order of 100 ohms and for the base-collector junction, on the order of 10,000 ohms. Thus, with a reasonable current amplification factor, $\alpha$, significant power amplification, on the order of 20 db, can be realized.

In FIG. 3 suitable ohmic contacts are made to the respective base, collector and emitter regions of the exemplary composite structure 1, and electrical leads are attached to these ohmic contacts. An input signal source 5 is connected across an input resistor 6 which in turn is in series with a bias source $\overline{V}_E$ which corresponds to the voltage $\overline{V}_E$ indicated in FIG. 2D on the energy band diagram. The voltage source $\overline{V}_E$ is shown as a battery arranged in the circuit such that the negative side is connected to the gallium arsenide emitter region 2 and the positive side to the germanium base region 3. In the output circuit a source of voltage $\overline{V}_C$, shown typically as a battery, is connected in series with a load resistor 7 and the output is taken across this load resistor. The voltage source $\overline{V}_C$ has its negative side connected to the base region 3 and its positive side to the collector region 4. In accordance with the basic principles heretofore outlined, the circuit of FIG. 3 will provide power amplification.

Although, as illustrated in FIG. 3, a common base configuration has been shown for the heterojunction triode in a typical circuit, it will be obvious to those skilled in the art that other configurations such as common-collector and common-emitter can likewise be used. In addition, although the application of the heterojunction triode of the present invention for amplification has been specifically illustrated, it will be apparent that the heterojunction triode can be used as a circuit element for the purpose of providing oscillations or to act as a switching device.

What has been disclosed is a single crystal semiconductor structure wherein are incorporated a plurality of heterojunctions, defined by different semiconductor materials, so as to provide unique device properties and capabilities. In forming the heterojunction structure, emphasis has been placed in the description on the germanium and gallium arsenide system, but the principles set forth heretofore are valid for other heterojunction systems, that is, other epitaxially compatible semiconductor materials can be used to form heterojunctions. For example, silicon and gallium arsenide may be selected for this purpose.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor heterojunction triode comprising three regions, the first region being constituted of a semiconductor material having a first energy band gap, second and third regions being in contact with said first region and being constituted of a semiconductor material having an energy band gap different from said first energy band gap, at least two immediately contiguous regions being of the same conductivity-type.

2. A semiconductor heterojunction triode as defined in claim 1 wherein all three regions are of the same conductivity-type.

3. A semiconductor heterojunction triode as defined in claim 2 where the regions are all of N-conductivity-type.

4. A semiconductor heterojunction triode comprising three regions of semiconductor material, the first region being constituted of a first semiconductor material having a first energy band gap, the second and third regions being constituted of a second semiconductor material having a second energy band gap, in contact with respectively opposite surfaces of said first region, the surfaces of said second and third regions which are in contact with said first region having different energy barrier heights, at least two immediately contiguous regions being of the same conductivity-type.

5. A semiconductor heterojunction triode as defined in claim 4 wherein all three regions are of the same conductivity-type.

6. A semiconductor heterojunction triode as defined in claim 5 wherein all three regions are of N-conductivity-type.

7. A heterojunction triode as defined in claim 4 wherein said first semiconductor material is germanium, said second semiconductor material is gallium arsenide, the surfaces of said second and third regions which are in contact with said germanium being the [111]A surface and the [111]B surface of said gallium arsenide.

8. A semiconductor heterojunction device comprising three regions, the first region being constituted of a semiconductor material having a first energy band gap, second and third regions being in contact with said first region and being constituted of a semiconductor material having an energy band gap different from said first energy band gap, said first and second regions defining a first abrupt, asymmetrically conductive, junction and said first and third regions defining a second abrupt, asymmetrically conductive, junction, at least two immediately contiguous regions of said three regions being of the same conductivity type, first means for biasing said first junction in the forward bias state and second means for biasing said second junction in the reverse bias state.

9. A semiconductor heterojunction device as defined in claim 8 wherein said first region is constituted of germanium, said second and third regions are constituted of gallium arsenide and wherein said first means for biasing comprises a voltage source with its positive side connected to said first region and its negative side connected to said second region and said second means for biasing comprises a voltage source with its negative side connected to said first region and its positive side to said third region.

10. A semiconductor heterojunction device comprising at least three regions, the first region, serving as the base, constituted of a semiconductor material having a first energy band gap, second and third spaced regions, serving as emitter and collector respectively, in contact with said first region and constituted of a semiconductor material having an energy band gap different from said first energy band gap, said first and second regions defining a first asymmetrically conductive junction and said first and third regions defining a second asymmetrically conductive junction; separate ohmic contacts to each of said three regions; means for biasing said first junction in the forward bias state to inject carriers from said second region into said first region, said carriers being majority carriers in said first region; means for biasing said second junction in the reverse bias state to collect the injected carriers; signal means for controlling the flow of said carriers.

11. A semiconductor heterojunction device as defined in claim 10 wherein said second and third regions are both constituted of a semiconductor material having the same energy band gap.

12. A semiconductor device as defined in claim 11 wherein the semiconductor material having a first energy band gap is germanium and the semiconductor material having an energy band gap different from said first energy band gap is GaAs.

References Cited by the Examiner

UNITED STATES PATENTS

| | | | |
|---|---|---|---|
| 2,817,783 | 12/57 | Loebner | 307—88.5 X |
| 3,041,509 | 6/62 | Belmont | 317—235 |
| 3,057,762 | 10/62 | Gans | 317—235 X |

FOREIGN PATENTS

| | | |
|---|---|---|
| 723,808 | 2/55 | Great Britain. |

OTHER REFERENCES

Anderson: Germanium-Gallium Arsenide Heterojunctions, IBM Journal of Research and Development, July 1960, vol. 4, No. 3, pages 283–287.

JOHN W. HUCKERT, *Primary Examiner.*

ARTHUR GAUSS, *Examiner.*